United States Patent
Badura

(10) Patent No.: US 6,462,553 B1
(45) Date of Patent: Oct. 8, 2002

(54) DEVICE AND METHOD FOR CONVERTING A CHARGE-FLOW INTO A FREQUENCY SIGNAL

(75) Inventor: Eugen Badura, Darmstadt (DE)

(73) Assignee: GSI Gesellschaft fuer Schwerionenforschung mbH, Darmstad (DE)

( * ) Notice: Subject to any disclaimer, the term of this patent is extended or adjusted under 35 U.S.C. 154(b) by 0 days.

(21) Appl. No.: 09/530,729

(22) PCT Filed: Sep. 10, 1999

(86) PCT No.: PCT/EP99/06716

§ 371 (c)(1),
(2), (4) Date: Jul. 11, 2000

(87) PCT Pub. No.: WO00/16110

PCT Pub. Date: Mar. 23, 2000

(30) Foreign Application Priority Data

Sep. 10, 1998 (DE) .......... 198 41 308

(51) Int. Cl.$^7$ .............. G01N 27/62
(52) U.S. Cl. .............. 324/459
(58) Field of Search .............. 324/679, 678, 324/674, 676, 677, 681, 457, 459, 464

(56) References Cited

U.S. PATENT DOCUMENTS 5,754,056 * 5/1998 Sauer .......... 324/679

* cited by examiner

Primary Examiner—N. Le
Assistant Examiner—Etienne P LeRoux
(74) Attorney, Agent, or Firm—Frommer Lawrence & Haug LLP; Ronald R. Santucci

(57) ABSTRACT

A device and a method for converting flow of charge into a frequency signal is proposed. The device comprises: two parallel circuit branches (Z; Z') which are arranged to receive flow of charge alternately and each of which has a series arrangement of a switching element (40; 40'), an integrator (10; 10') and a comparator (30; 30'), wherein the switching elements (40; 40') serve to supply the flow of charge to one of the two circuit branches (Z; Z') and in the receiving circuit branch (Z; Z') the integrator (10; 10') serves to integrate the flow of charge and is configured to be resettable and the comparator (30; 30') is configured to emit a signal when the integrated flow of charge corresponds to a specific threshold value signal.

26 Claims, 7 Drawing Sheets

CHARGE-FREQUENCY CONVERTER

DEVICE AND METHOD FOR CONVERTING A CHARGE-FLOW INTO A FREQUENCY SIGNAL

The present invention relates to a device and a method for converting flow of charge into a frequency signal.

Such a device, also known as a charge-frequency converter, is an electronic circuit that is used to measure flow of electric charge.

In a known circuit arrangement of a charge-frequency converter, an integrator and a comparator are connected in series. Electric charge is supplied to the arrangement on the input side via an input of the circuit and is integrated by the integrator. The integrator supplies to the amplifier a voltage signal which corresponds to the integral of the supplied charge. The integrated voltage signal is compared with a pre-set charge comparison value in the comparator. If the signal has reached the comparison value in terms of magnitude, the comparator emits a pulse to the output of the arrangement. The integrator is then reset, and the sequence of integration and comparison begins afresh. At the output of the arrangement, therefore, there is produced over time a sequence of pulses, the instantaneous frequency of which is a measure of the amount of electric charge supplied per unit of time—that is to say flow of charge.

A disadvantage of that arrangement is that the integrator cannot operate during the resetting operation, that is to say there is a dead time during which flow of charge cannot be measured. In time-critical applications, that is to say those in which the amount of charge supplied changes rapidly and has to be detected very quickly, too much time is lost by the resetting of the integrator in the circuit. This can lead to inaccurate measurements, which cannot be tolerated especially in the case of applications in which safety is a consideration, such as, for example, ion beam therapy.

The aim of the invention is therefore to provide a device and a method for converting flow of charge into a frequency signal that ensure exact, quick and reliable measurement of the charge. That aim is achieved by a device having the features according to claims 1 and 14 and by a method having the features according to claims 8 and 21. Advantageous developments are defined in the subsidiary claims.

The device according to the invention and the method according to the invention are associated with a number of advantages.

By virtue of the provision of two parallel circuit branches, when the flow of charge in one circuit branch has reached the pre-set threshold value and the associated integrator has to be reset, the measurement of the flow of charge can be continued in the other circuit branch. The dead time during the measurement for the resetting of the integrator is therefore eliminated.

The provision of various threshold values for each comparator results in a circuit have an extendable measuring range. In addition, the circuit branches are switched less often, so that the switching times and dead times associated with those switching operations are also minimized.

By connecting to the other circuit branch even while measurement is taking place in the one circuit branch it is also possible to eliminate the remaining switching time on the transition from one branch circuit to the other. There are thus provided a device and a method with which flow of charge can be measured continuously, that is to say without dead times.

In addition, the circuit is constructed from commercially available components, and can therefore be produced economically. In addition, the design characteristics of the circuit can be reliably reproduced in large-scale production.

The invention will be described in greater detail with reference to the awing, in which:

FIG. is a block circuit diagram of a charge-frequency converter according to a first embodiment of the invention;

FIGS. 2A, B is a block circuit diagram of a charge-frequency converter according to a second embodiment of the invention;

Figure 6:
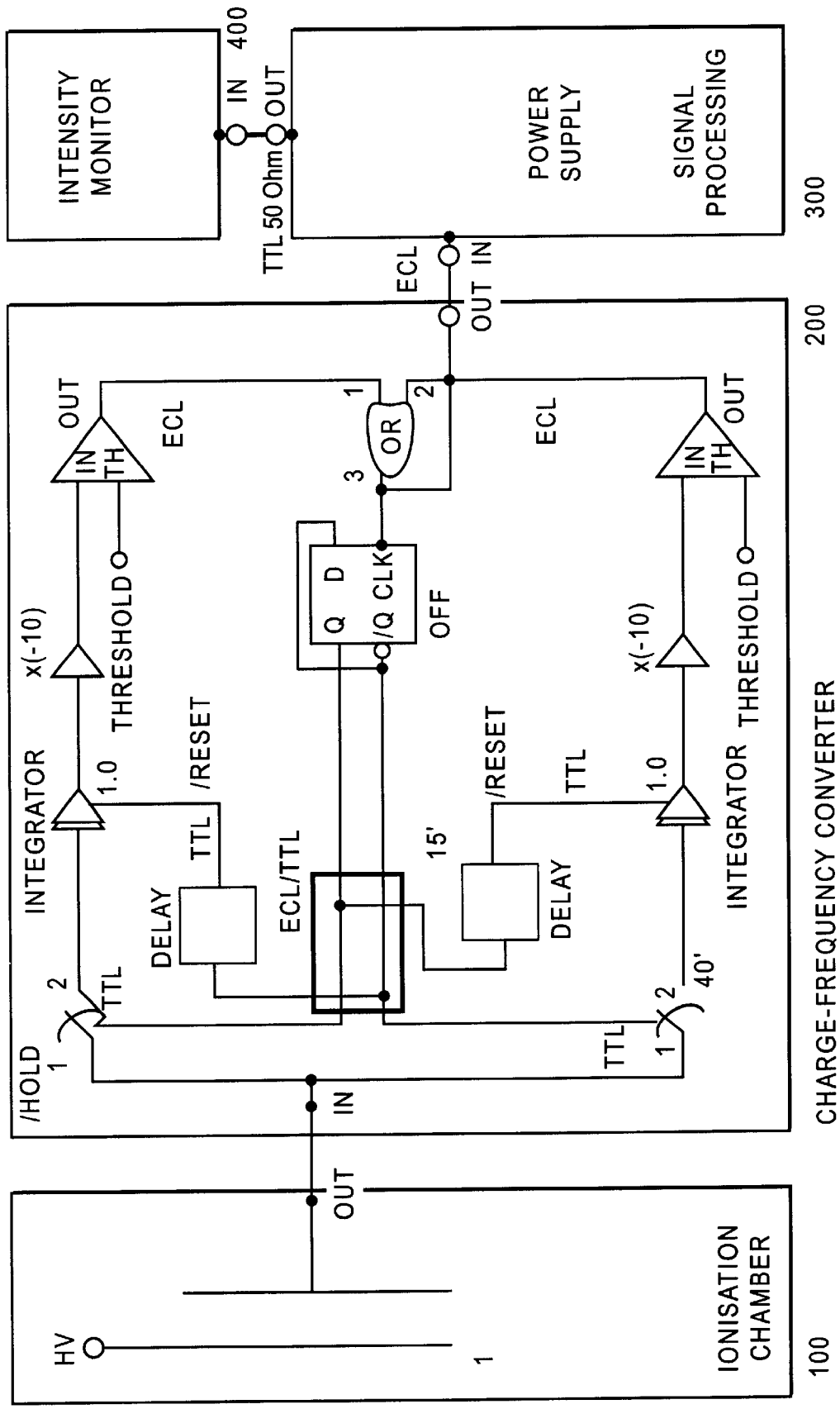

FIG. is a graph showing characteristic curves for the charge-frequency converter according to the second embodiment of the invention and FIG. 6 is a block circuit diagram of an application of the charge-frequency converter according to the invention.

Figure 1:
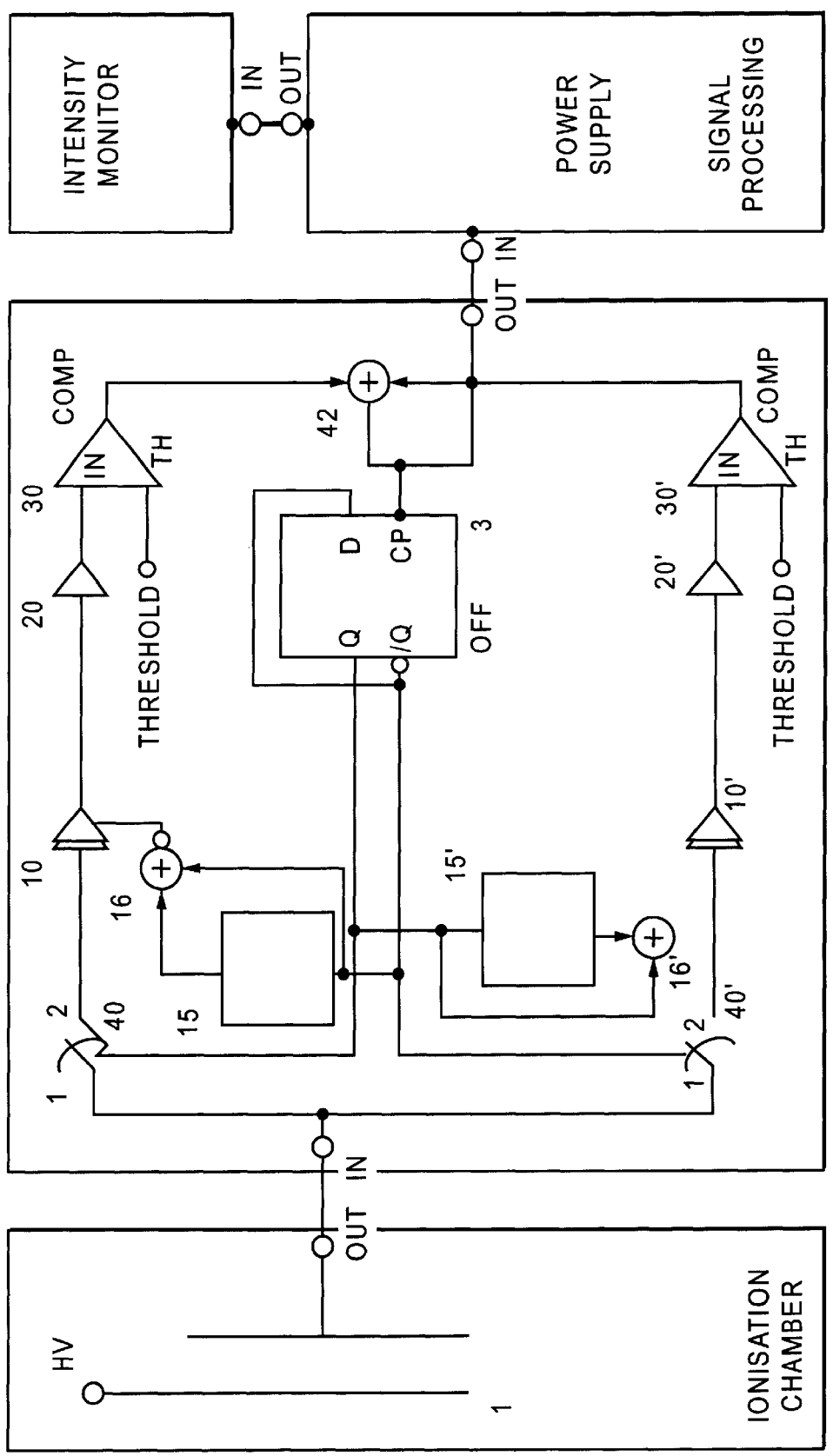

FIG. 1 shows the construction of a charge-frequency converter in the form of a block circuit diagram in accordance with the first embodiment of the invention. The charge-frequency converter consists essentially of two parallel circuit branches (also referred to as single-pulse groups) Z, Z' which are identically constructed. The circuit branches Z, Z' are each connected to or disconnected from the output 1 in opposite phase to one another by a switching element 40, 40'. Each of the branches has an integrator 10, 10' which serves for summing the flow of charge supplied via the switching element 40 or 40' just closed and for emitting a voltage signal corresponding to the integral. The output of the integrator is connected to an amplifier 20, 20'. The voltage signal is supplied to a comparator 30, 30'. To the second input of the comparator 30, 30' there is applied a threshold voltage signal in the form of a comparison signal. The threshold voltage signal—a direct voltage—is set in terms of its magnitude by a voltage divider.

The two comparators 30, 30' are coupled on the output side via an adder 4 to a D-flip-flop 3, by means of which the integrator 10 or 10' is reset by means of a respective time-delay element 15, 15' and the switching elements 40, 40' are actuated. Each of the two complementary outputs Q, Q of the D-flip-flop 3 is connected to one of the two switching elements 40, 40'. As a result, the two switching elements are connected so as to be in opposite phase to one another. Downstream of the adder 4 there is a pick-off 42 for the output signal.

The two branches Z, Z' are therefore active alternately, that is to say while in the connected branch the flow of charge signal is being integrated, amplified and compared with the threshold voltage, the disabled branch is non-operative; there is sufficient time for the integrator therein to be reset to zero.

The integrator 10, 10' of the connected branch integrates the flow of charge signal supplied from the input of the circuit and converts the integrated flow of charge signal into a voltage signal. The voltage signal is amplified in the amplifier 20, 20' and is then supplied to one of the inputs of the comparator 30, 30'. The comparator 30, 30' compares that signal in terms of magnitude with the threshold voltage applied to its other input. When the integrated flow of charge signal reaches the threshold voltage, the comparator emits a pulse at its output. That pulse passes by way of the adder 4 to the D-flip-flop 3. The D-flip-flop 3 changes its state, that is to say the signals at its outputs Q and Q are each inverted. As a result, the previously open switching element is closed, the previously closed switching element is opened and the associated integrator is reset. The resetting here takes place immediately, but the cancelling of the resetting does not take place until a short time (typical value: 50 ns) after the branch in question has been connected. For this purpose there are provided time-delay elements 15, 15' which prevent a situation in which a current surge occurring when the branch in question is connected is integrated by the integrator 10, 10' and the measurement is falsified.

The sequence described above then proceeds in the other branch, while the previously active branch is non-operative.

The two branches therefore alternately supply pulses to the adder 4, so that there is produced at the pick-off 42 a sequence of pulses over time, the frequency of which represents the input-side flow of charge per unit of time.

The resolution of this circuit is 10 pC/pulse, the flow of charge is 25 $\mu$C/s. Using this circuit it is possible to generate output signals with frequencies up to 1 MHz for beam intensities of from $10^6$ to $10^8$ particles per second. The error rate in this case remains below 3%.

Figure 2A:
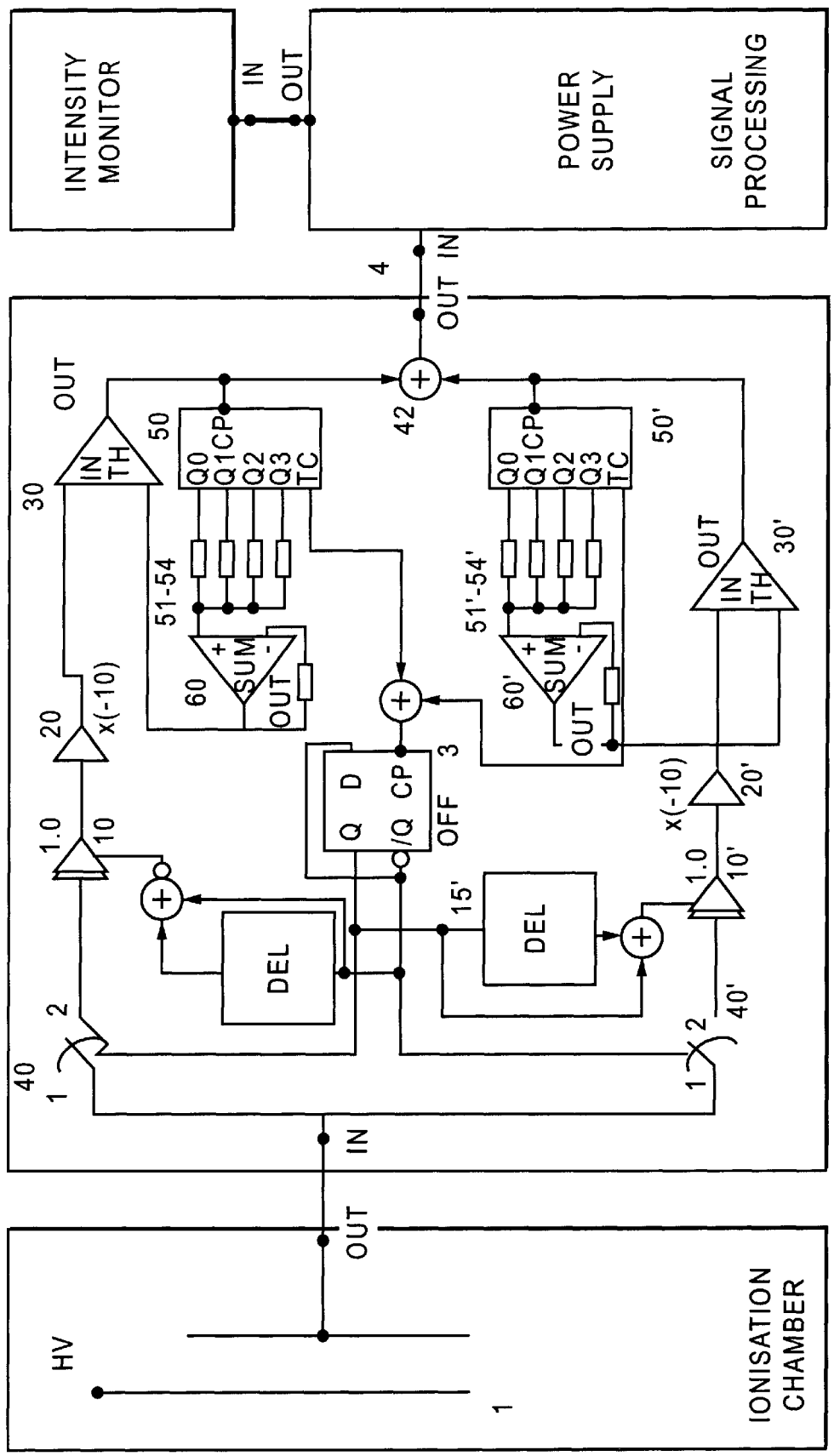

The error rate can be reduced further if the switchover between the two branches takes place less frequently. This is achieved with a circuit in accordance with FIG. 2A, B. FIG. 2A shows the construction of a charge-frequency converter in the form of a block circuit diagram in accordance with the second embodiment of the invention. In comparison with the circuit of FIG. 1 this circuit has been supplemented by a component 50, 60 and 50', 60' in order to generate different threshold voltage values. The threshold voltage values are generated by connecting up various resistors 51–54 and 51'–54' to the input of the operational amplifiers 60, 60'. Connecting up one of the threshold voltage values is effected by binary counter modules 50, 50' which are each triggered by the pulses of the output signals from the comparators 30, 30'. With the four resistors 51–54 and 51'–54' it is therefore possible to generate 16 different threshold voltage values (or staircase voltages). In a case where the resistance ratio between two adjacent resistors is 2:1, therefore, the measuring range can be extended 15-fold. In this embodiment too, the dimensions of the two branches Z, Z' are identical in terms of circuitry.

As in the first embodiment, the flow of charge signal to be measured is supplied to one of the two branches by phases of the two switching elements 40, 40'. Departing from the first embodiment, in this case the two branches are connected not in exactly opposite phase to one another, but slightly overlapping in time, that is to say the closure times of the two switching elements overlap at the beginning and end of each phase.

Assume that branch Z is the active branch. At the beginning of a phase of the active branch the integrator 10 is set to zero and the lowest threshold voltage value is applied to the comparator 30. When the integrated flow of charge signal supplied by the amplifier 20 has reached the first threshold voltage value in terms of magnitude, then—as in the first embodiment—a pulse is emitted to the output. Departing from the charge-frequency converter of the first embodiment, however, the integrator is not reset and, in addition, neither of the switching elements is switched, that is to say the branch Z continues to be active. The binary counter 50 is now actuated, which then generates the next highest threshold voltage value by connecting a different combination of resistors 51–54 and applies that value to the input of the comparator 30. The integration operation is continued until the integrated flow of charge signal has reached the current threshold voltage value in terms of magnitude. Then, a pulse is again emitted and the cycle begins afresh. That cycle is repeated until the last of the 16 threshold voltage values has been reached; only then is the active branch Z disconnected and the integrator 10 reset.

The other branch Z', however, is connected not when the last threshold voltage value of the other branch Z has been reached, but when the penultimate threshold voltage value is reached. Accordingly, during the last measuring phase both branches Z, Z' are active. As a result, it is also possible to eliminate the measurement error that results from the delay occurring when a switching element is connected at the beginning of a branch phase.

The above-described cycle is then repeated in the same manner for the branch Z'.

Figure 3:
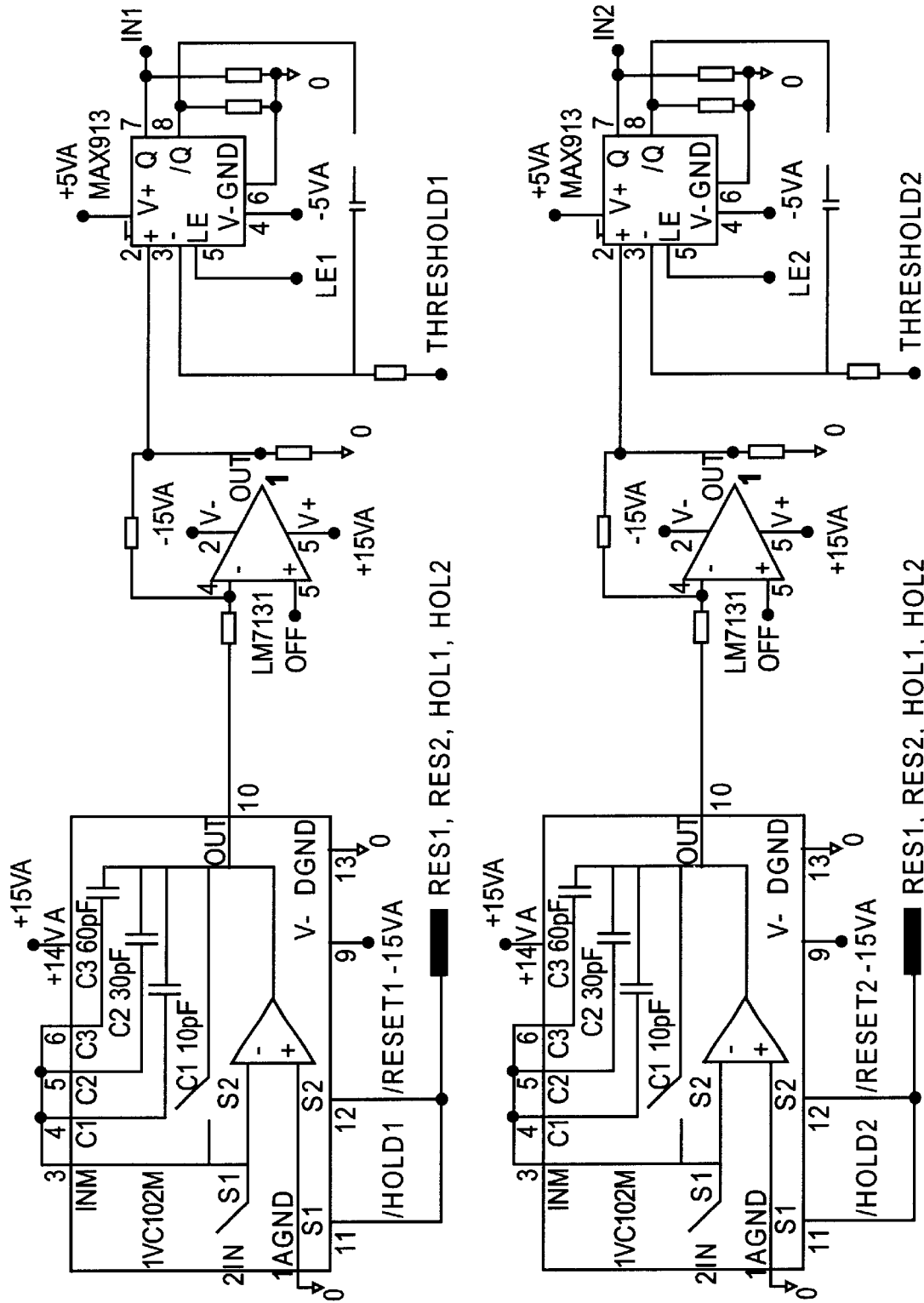
FIG. 3 is a circuit diagram of the analog portion of the charge-frequency converter according to the second embodiment of the invention.

FIG. 3 shows a circuit diagram for the analog portion of the charge-frequency converter which is common to both embodiments of the invention. Each integrator 10, 10' is realised by an operational amplifier (OPAMP) having capacitive feedback circuitry 15, 15', the supplied flow of charge is switched via switching elements 40, 40' to the inverting input. The amplifiers 20, 20' and the comparators 30, 30' are realised by further OPAMPs having corresponding circuitry.

Figure 4:
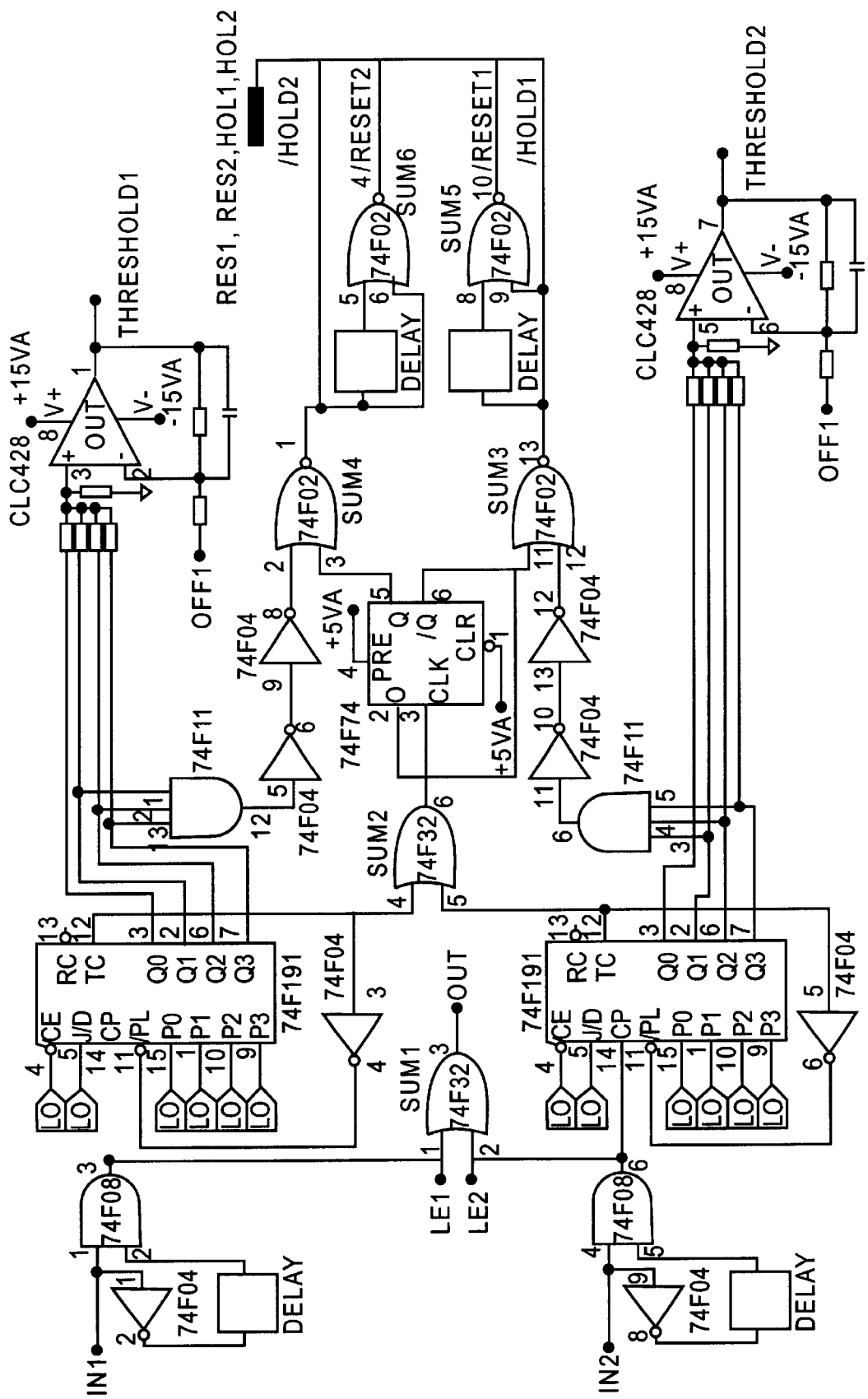
FIG. 4 is a circuit diagram of the digital portion and the threshold voltage generators of the charge-frequency converter according to the second embodiment of the invention.

FIG. 4 shows a circuit diagram for the digital portion of the charge-frequency converter and the threshold voltage generators in accordance with the second embodiment of the invention.

The threshold voltage generator can in principle be constructed in various ways, it being important that with every pulse (down to about 10 ns) it reliably generates a new voltage pulse at the output within a period of less than 100 ns. It will be understood that the threshold voltages can be graduated differently. The threshold value generator will then contain a correspondingly greater or smaller number of resistors and a counter having a suitably matched number of digits.

Instead of a binary counter it is also possible to use a different circuit with which staircase voltages can be selected one after another.

Figure 2B:
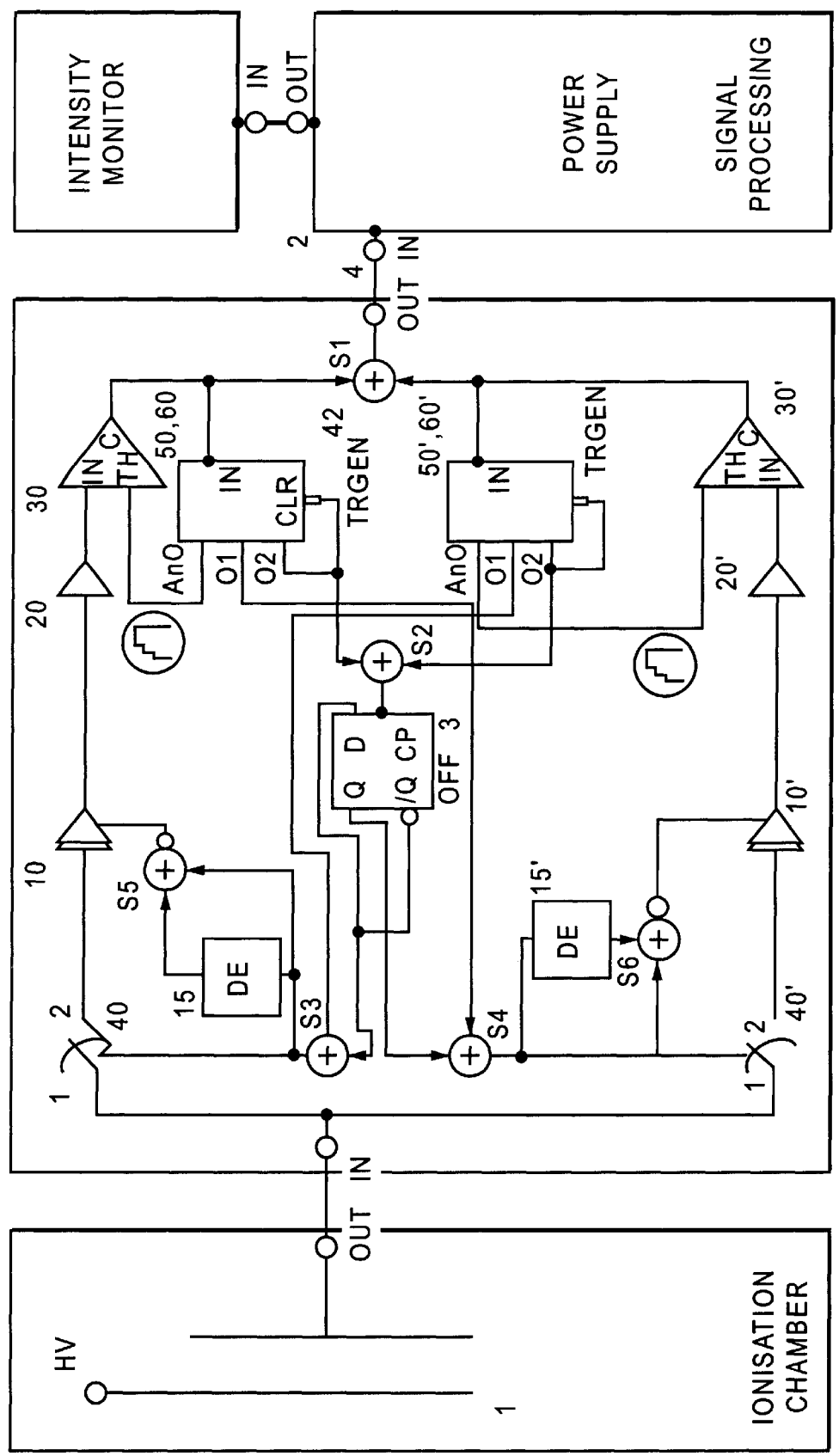

Instead of generating the various voltage values by connecting up different resistance values to the operational amplifier 60, 60', the threshold voltage generator 50, 50'; 60, 60' can also be realised by means of a digital/analog converter which converts a binary number into a voltage value. FIG. 2B shows the embodiment of FIG. 2A modified to that effect.

With a circuit according to the second embodiment it is possible, using the components indicated in FIG. 3 and FIG. 4, to measure flows of charge of from $10^{-14}$ to $10^{-4}$ C/s.

Figure 5:
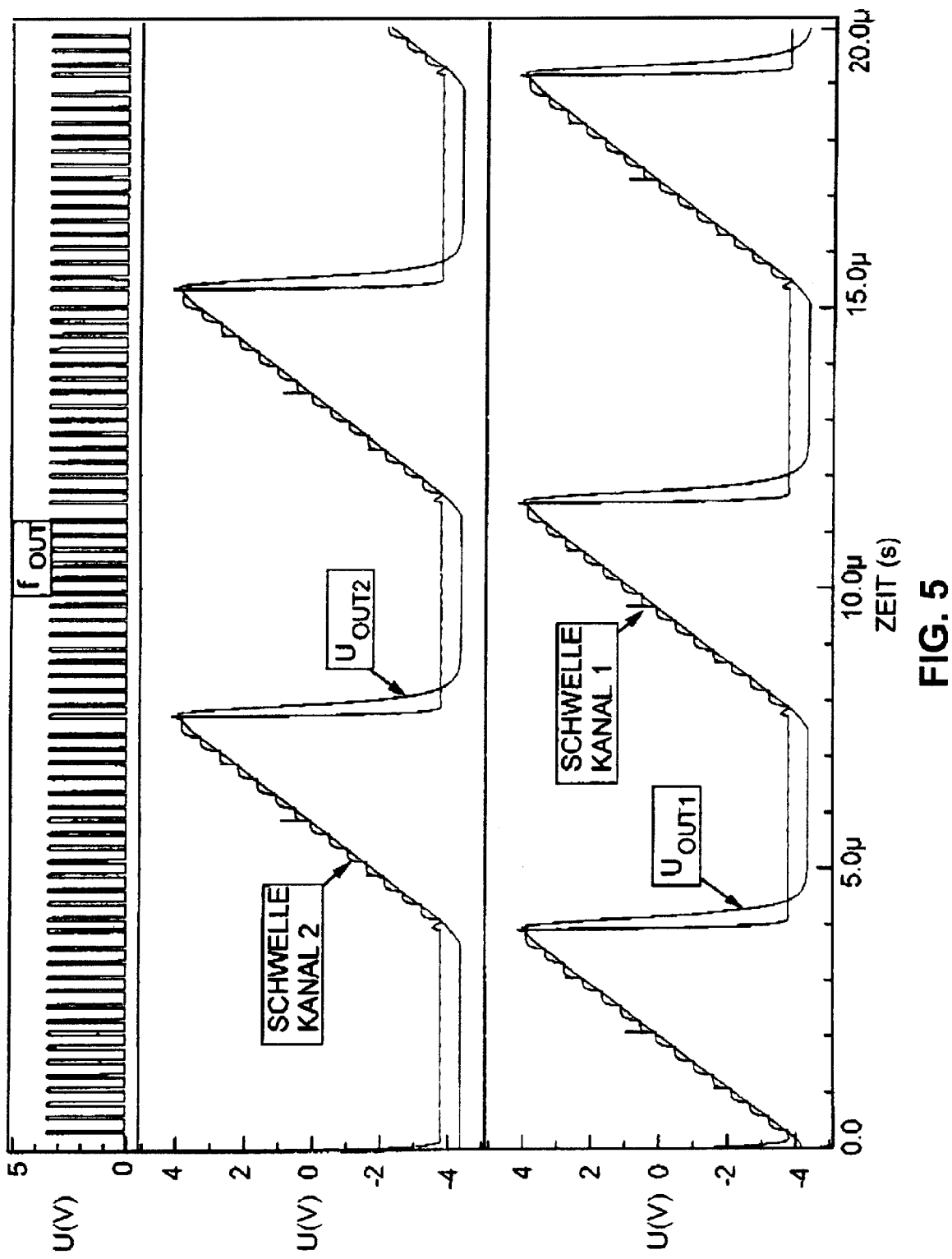

FIG. 5 is a graph showing characteristic curves for the charge-frequency converter in accordance with the second embodiment. The graph shows, plotted over the horizontal time axis, in the lower graph the voltage curves at the two inputs of the comparator 30 in branch Z, in the middle graph the voltage curves at the two inputs of the comparator 30' in branch Z' and at the top the output signal supplied to the output 4. The threshold voltage values are in staircase form equidistantly between –4 V and 4 V. The integrated voltage signal Uout1 or Uout2 supplied to the comparators here represents a flow of charge at input 1 that is constant over time. Each point of contact of Uout1 and Uout2 with a threshold voltage value corresponds to a voltage pulse in the output signal. It follows from the overlapping phasing of the two switches 40, 40' that the charge supplied in the period of overlap is distributed to both branches Z1, Z2. This has the result that the end of each rising flank Uout1 or Uout2 overlaps in time with the beginning of the rising flank Uout2 or Uout1 that follows in the other branch. The next threshold voltage value is therefore reached slightly later, so that a slightly larger break then appears in the output signal.

If it is not necessary for the dead times caused by the switching of the switching elements 40, 40' to be totally eliminated, the principle of extending the measuring range by means of the circuit components 50, 60 and 50', 60' in accordance with the second embodiment can be combined directly with the charge-frequency converter in accordance with the first embodiment.

The charge-frequency converter according to the invention and the method according to the invention have a wide variety of applications. FIG. 6 shows a block circuit diagram of an application where the charge-frequency converter according to the invention is used for measuring the intensity of heavy ion beams in radiotherapy. The detector for the ion beams is provided by an ionisation chamber 100, which is placed in the ion beam, where the ion beams passing through generate charge. The magnitude of the charge generated is proportional to the ions passing through the ionisation chamber. The charge is supplied to the charge-frequency converter 200. The output signal of the charge-frequency converter is supplied via a signal processing unit 300 to an intensity monitor 400, where an evaluation of the measured signal is effected for the purpose of monitoring the irradiation or switching off the beam. It is precisely for such an application that the quick, reliable and accurate measurement of intensity achieved by the device according to the invention is of the greatest importance.

What is claimed is:

1. Device for converting flow of charge into a frequency signal, having:
   two parallel circuit branches (Z; Z'),
   which are arranged to receive flow of charge alternately and each of which has a series arrangement of a switching element (40; 40'), an integrator (10; 10') and a comparator (30; 30'), wherein the switching elements (40; 40') serve to supply the flow of charge to one of the two circuit branches (Z; Z') and in the receiving circuit branch (Z; Z') the integrator (10; 10') serves to integrate the flow of charge and is configured to be resettable and the comparator (30; 30') is configured to emit a signal when the integrated flow of charge corresponds to a specific threshold value signal.

2. Device according to claim 1, characterized in that it has control means (3, 15, 16; 3', 15', 16') for resetting the integrators (10; 10') and for actuating the switching elements (40; 40') when the integrated flow of charge corresponds to the specific threshold value signal.

3. Device according to claim 1, characterized in that an amplifier (20, 20') is connected between each switching element (40, 40') and the respective integrator (10, 10').

4. Device according to claim 1, characterized in that the signal emitted in each case is a single pulse.

5. Device according to claim 1, characterized in that the flow of charge is a measure of detected ion particles.

6. Device according to claims 2, characterized in that each of the circuit branches (Z; Z') has a circuit (50, 60; 50', 60') for the cyclic selection of a threshold value signal from a series of threshold value signals and the specific threshold value signal, and when the integrated flow of charge corresponds to the selected threshold value signal in the receiving circuit branch (Z; Z') the comparator (30; 30') emits a signal and the threshold value signal that is next in the cycle is selected from the series.

7. Device according to claim 6, characterized in that the threshold value signals are ordered in ascending order in terms of their value and adjacent threshold value signals have a constant difference in value relative to one another.

8. Method for converting flow of charge into a frequency signal, iteratively executing the following sequence of steps:
   supplying flow of charge to one of two circuit branches,
   integrating the flow of charge in the receiving circuit branch,
   comparing the integrated flow of charge with a specific threshold value signal,
   when the integrated flow of charge corresponds to the specific threshold value signal:
   generating an output signal
   resetting the integrator of the receiving circuit branch and
   supplying flow of charge to the other circuit branch.

9. Method according to claim 8, characterized in that the integrated flow of charge is voltage-amplified.

10. Method according to claim 8, characterized in that the signal emitted in each case is a single pulse.

11. Method according to claim 8, characterized in that the flow of charge is a measure of detected ion particles.

12. Method according to claim 8, characterized in that in the receiving branch a threshold value signal is selected cyclically from a series of different threshold value signals and the specific threshold value signal, and when the integrated flow of charge corresponds to the selected threshold value signal in the receiving circuit branch a signal is emitted and the threshold value signal that is next in the cycle is selected from the series.

13. Method according to claim 12, characterized in that the threshold value signals are ordered in ascending order in terms of their value and adjacent threshold value signals have a constant difference in value relative to one another.

14. Device for converting flow of charge into a frequency signal, having:
   two parallel circuit branches (Z; Z'), which are arranged to receive flow of charge and each of which has a series arrangement of a switching element (40; 40'), an integrator (10; 10') and a comparator (30; 30') and a circuit (50, 60; 50', 60') for cyclically selecting a threshold value signal from a series of predetermined threshold value signals, wherein
   each of the switching elements (40; 40') serves to supply flow of charge to the associated circuit branch (Z; Z'),
   each of the integrators (10; 10') serves to integrate the flow of charge and is configured to be resettable and the comparators (30; 30') are configured to emit a signal when the integrated flow of charge corresponds to a threshold value signal,
   wherein in the receiving circuit branch (Z; Z'), when the integrated flow of charge corresponds to a threshold value signal the corresponding comparator (30; 30') emits a signal and in the circuit (50, 60; 50', 60') the threshold value signal that is next in the cycle is selected and
   wherein when in one circuit branch (10; 10') a first predetermined threshold signal from the series of threshold value signals has been reached, the switching element in the other branch (10'; 10) is connected and
   wherein when in the one circuit branch (10; 10') a second predetermined threshold signal from the series of threshold value signals has been reached, the associated switching element is disabled and the associated integrator is reset.

15. Device according to claim 14, characterized in that an amplifier element (20; 20') is connected between each switching element (40; 40') and the respective integrator (10; 10').

16. Device according to claim 14, characterized in that the signal emitted in each case is a single pulse.

17. Device according to any one of claim 14, characterized in that the flow of charge is a measure of detected ion particles.

18. Device according to claim 14, characterized in that the threshold value signals of the series are ordered in ascending order in terms of their value and adjacent threshold value signals have a constant difference in value relative to one another.

19. Device according to claim 18, characterized in that the first predetermined threshold value signal is the second greatest in terms of value and the second is the greatest in terms of value of the series.

20. Device according to claim 14, characterized in that it has control means (3, 15, 16; 3', 15', 16') for resetting the integrators (10; 10') and for actuating the switching elements (40; 40') when the integrated flow of charge corresponds to the second specific threshold value signal.

21. Method for converting flow of charge into a frequency signal, iteratively executing the following sequence of steps:
   supplying flow of charge to one of two parallel circuit branches,
   integrating the flow of charge in the circuit branch receiving flow of charge,
   comparing the integrated flow of charge with a threshold value signal from a series of threshold value signals,
   when the integrated flow of charge in the receiving circuit branch corresponds to the threshold value signal:
   generating an output signal
   selecting the threshold value signal that is next in the cycle from the series,
   when the integrated flow of charge in the one receiving circuit branch corresponds to a first specific threshold value signal:
   supplying flow of charge also to the other circuit branch,
   when the integrated flow of charge in the one receiving circuit branch corresponds to a second specific threshold value signal:
   disconnecting that circuit branch from the flow of charge.

22. Method according to claim 21, characterized in that the integrated flow of charge is voltage-amplified.

23. Method according to claim 21, characterized in that the signal emitted in each case is a single pulse.

24. Method according to claim 21, characterized in that the flow of charge is a measure of detected ion particles.

25. Method according to claim 21, characterized in that the threshold value signals are ordered in ascending order in terms of their value and adjacent threshold value signals have a constant difference in value relative to one another.

26. Method according to claim 25, characterized in that the first predetermined threshold value signal is the second greatest in terms of value and the second is the greatest in terms of value of the series.

* * * * *